(12) United States Patent  
Komatsu et al.

(10) Patent No.: US 8,441,133 B2  
(45) Date of Patent: May 14, 2013

(54) SEMICONDUCTOR DEVICE

(75) Inventors: Daiki Komatsu, Ogaki (JP); Kazuhiro Yoshikawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 477 days.

(21) Appl. No.: 12/695,722

(22) Filed: Jan. 28, 2010

(65) Prior Publication Data

US 2010/0244242 A1 Sep. 30, 2010

Related U.S. Application Data

(60) Provisional application No. 61/165,286, filed on Mar. 31, 2009.

(51) Int. Cl.
*H01L 23/48* (2006.01)

(52) U.S. Cl.
USPC .................................. 257/777; 257/E23.068

(58) Field of Classification Search .................. 257/737, 257/738, 777, 685–686, 778, E23.015
See application file for complete search history.

(56) References Cited

U.S. PATENT DOCUMENTS

| | | | | |
|---|---|---|---|---|
| 5,832,600 A | * | 11/1998 | Hashimoto | ...................... 29/841 |
| 6,583,516 B2 | * | 6/2003 | Hashimoto | .................... 257/781 |
| 7,184,276 B2 | * | 2/2007 | Hashimoto | .................... 361/803 |

FOREIGN PATENT DOCUMENTS

| | | |
|---|---|---|
| JP | 2000-138328 A | 5/2000 |
| JP | 2002-83922 | 3/2002 |
| JP | 2003-68779 A | 3/2003 |
| JP | 2004-273938 | 9/2004 |
| JP | 2005-150344 A | 6/2005 |
| JP | 2007-317822 A | 12/2007 |
| JP | 2008-91810 | 4/2008 |

* cited by examiner

*Primary Examiner* — Hoa B Trinh

(74) *Attorney, Agent, or Firm* — Oblon, Spivak, McClelland, Maier & Neustadt, L.L.P.

(57) ABSTRACT

A semiconductor device including a first substrate having first and second surfaces, multiple first mounting pads formed on the first surface of the first substrate and for mounting a first semiconductor element on the first surface of the first substrate, multiple first connection pads formed on the first surface of the first substrate and positioned on the periphery of the multiple first mounting pads, a second substrate formed on the first substrate and having first and second surfaces, the second substrate having a second penetrating electrode which penetrates through the first and second surfaces of the second substrate, multiple second mounting pads formed on the first surface of the second substrate and for mounting a second semiconductor element, and a conductive member formed on one of the first connection pads and electrically connecting an end portion of the second penetrating electrode and the one of the first connection pads.

20 Claims, 9 Drawing Sheets

FIG. 7
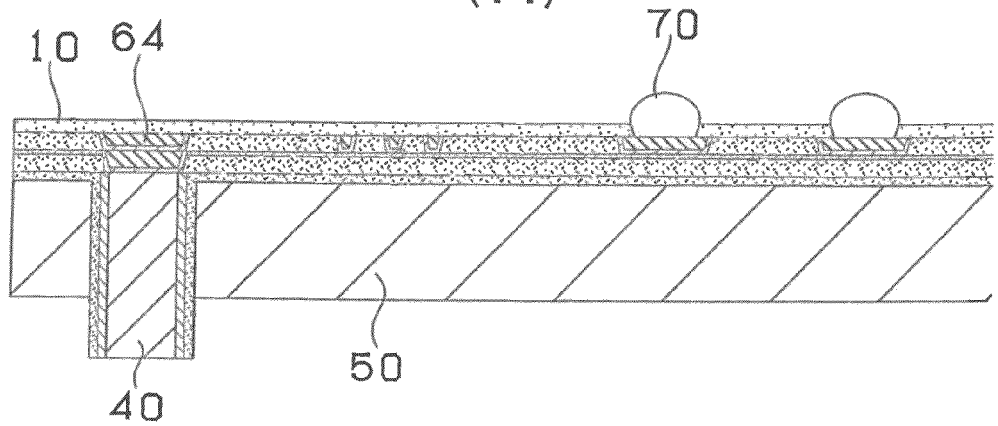
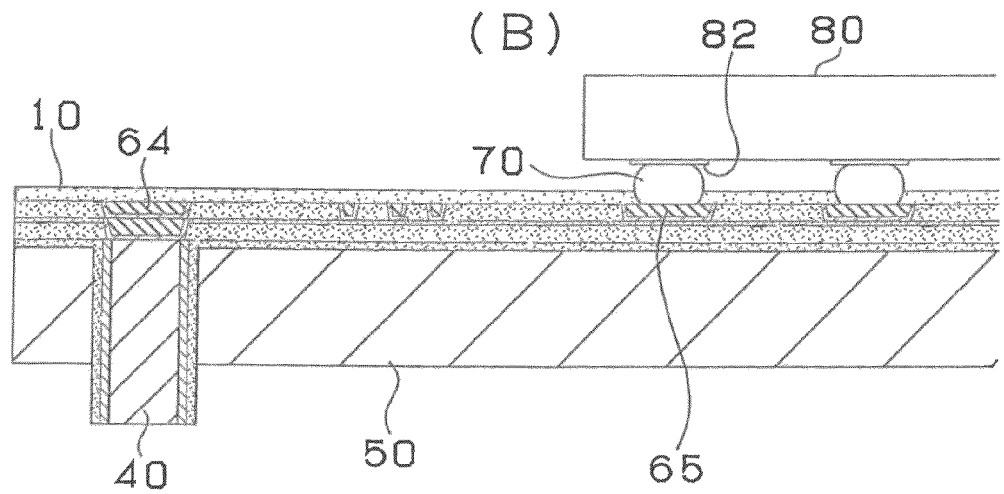
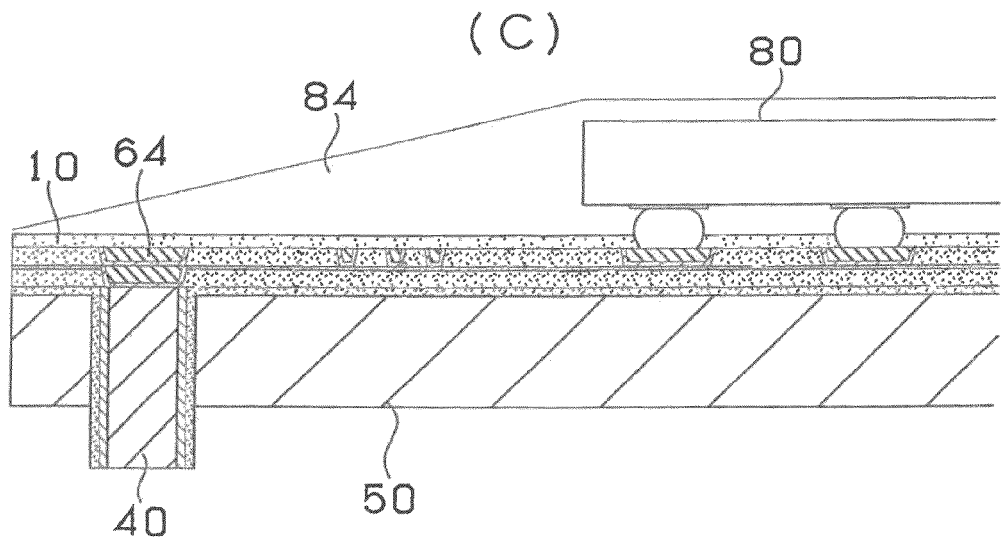

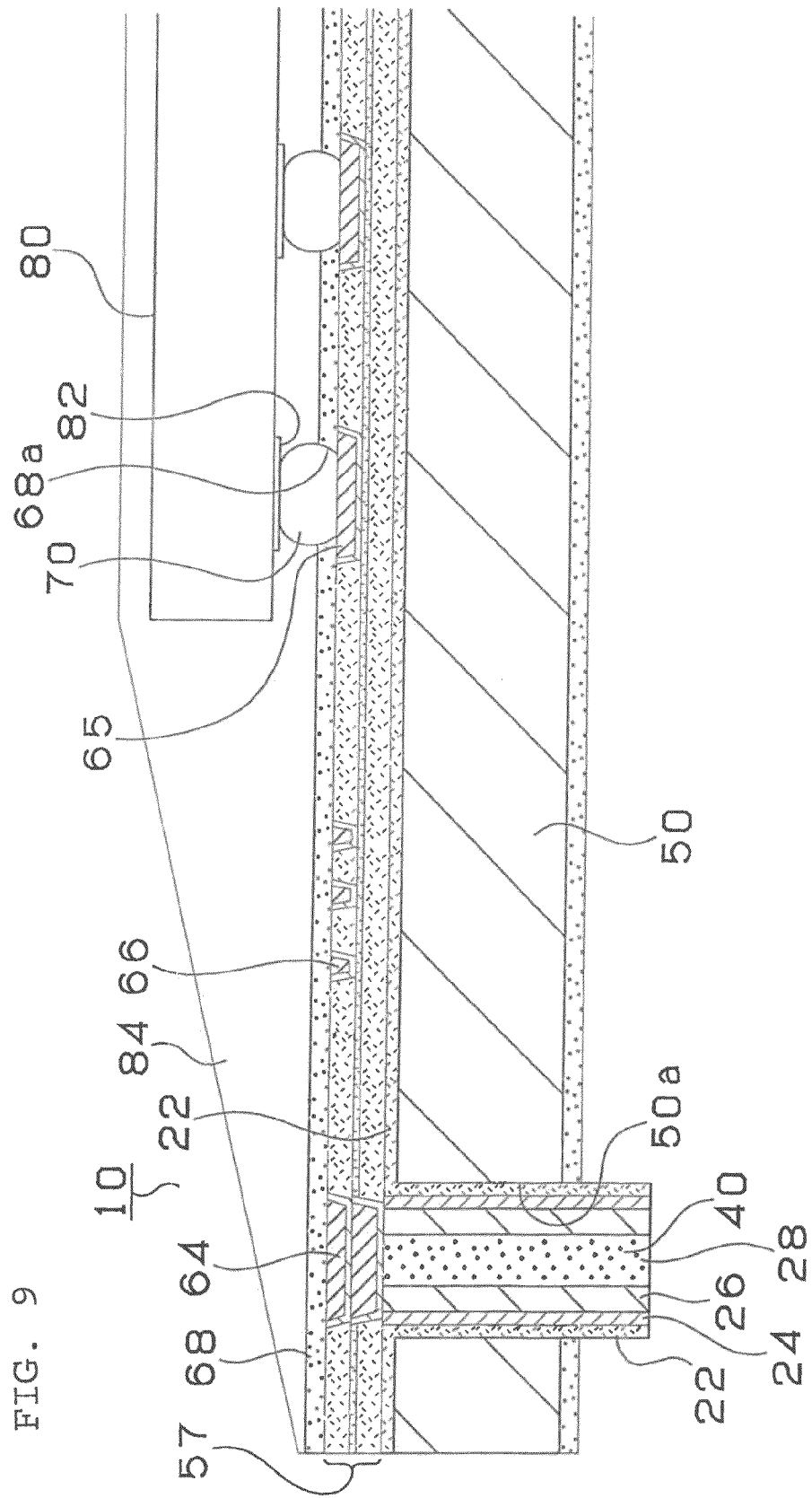

SEMICONDUCTOR DEVICE

CROSS-REFERENCE RELATED APPLICATIONS

The present application claims the benefits of priority U.S. Application No. 61/165,286, filed Mar. 31, 2009. The contents of that application are incorporated herein by reference in their entirety.

BACKGROUND OF THE INVENTION

1. Field of the Invention

The present invention is related a semiconductor device formed by tri-dimensionally laminating multiple semiconductor elements. Especially, the present invention is related a semiconductor device formed with a POP (Package on Package) made up of at least two substrates in which one packaging substrate is electrically connected another packaging substrate.

2. Discussion of the Background

In accordance with recent developments in electronic equipment, semiconductor devices be used in electronic equipment are required be more compact, thinner, more diversified, and more highly functional and integrated. To respond such demands, the structure of semiconductor-device packaging is becoming tridimensional with multiple stacked semiconductor devices or multiple semiconductor elements. Japanese Laid-Open Patent Publication 2004-273938 describes a stacked semiconductor device where a semiconductor element is sandwiched between a first wiring substrate and a second wiring substrate and the first wiring substrate and the second wiring substrate are electrically connected by solder bumps. The contents of this publication are incorporated herein by reference in their entirety.

SUMMARY OF THE INVENTION

According one aspect of the present invention, a semiconductor device includes a first substrate having first and second surfaces, multiple first mounting pads formed on the first surface of the first substrate and for mounting a first semiconductor element on the first surface of the first substrate, multiple first connection pads formed on the first surface of the first substrate and positioned on the periphery of the multiple first mounting pads, a second substrate formed on the first substrate and having first and second surfaces, the second substrate having a second penetrating electrode which penetrates through the first and second surfaces of the second substrate, multiple second mounting pads formed on the first surface of the second substrate and for mounting a second semiconductor element, and a conductive member formed on one of the first connection pads and electrically connecting an end portion of the second penetrating electrode and the one of the first connection pads.

BRIEF DESCRIPTION OF THE DRAWINGS

A more complete appreciation of the invention and many of the attendant advantages thereof will be readily obtained as the same becomes better understood by reference the following detailed description when considered in connection with the accompanying drawings, wherein:

FIG. 7 are views showing the steps of manufacturing a second substrate of the example;

FIG. 9 is a cross-sectional view showing the structure of a semiconductor device according the third modified example.

DETAILED DESCRIPTION OF THE EMBODIMENTS

Figure 1:
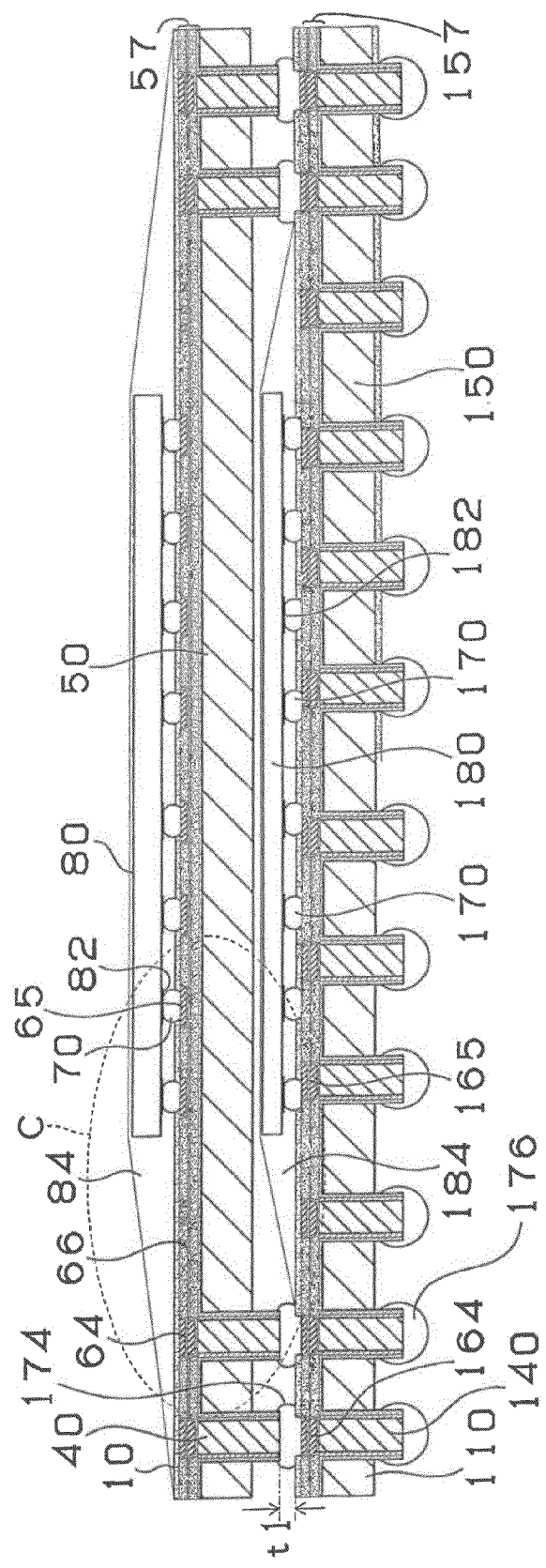
FIG. 1 is a cross-sectional view showing the structure of a semiconductor device according an example of the present invention.

The embodiments will now be described with reference the accompanying drawings, wherein like reference numerals designate corresponding or identical elements throughout the various drawings.

A semiconductor device of the present invention is described with reference to FIGS. 1-8.

Figure 8:
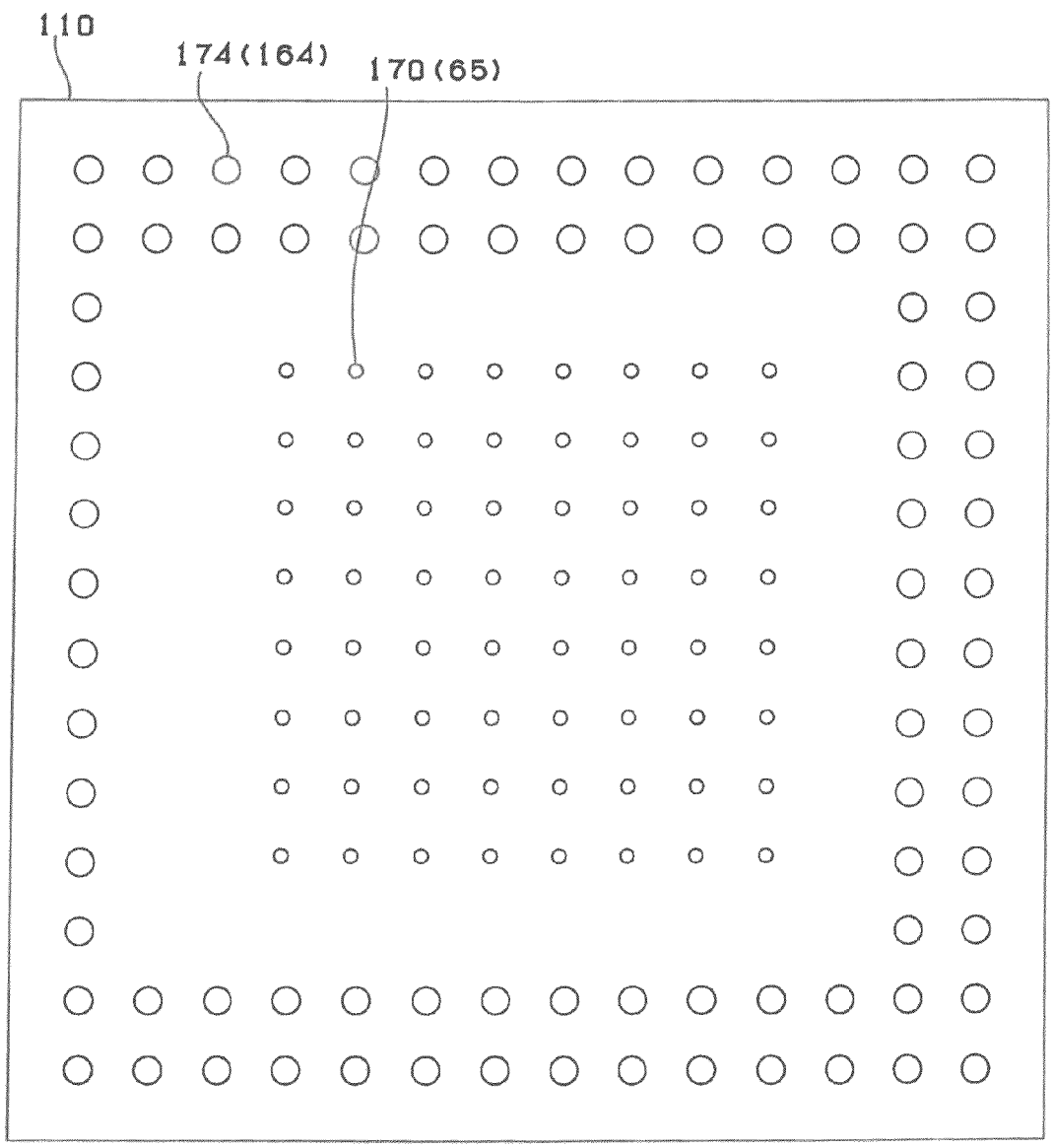
FIG. 8 is a plan view showing a first substrate of the example.

FIG. 1 is a cross-sectional view of a semiconductor device according the present example. The semiconductor device is a so-called package-on-package device in which second wiring substrate 10 for mounting IC chip 80 containing multiple memories or the like is stacked on first wiring substrate 110 for mounting logic IC chip 180 such as a CPU. First wiring substrate 110 has first core base material 150, first penetrating electrodes 140 formed inside the first core base material provide electrical continuity between the upper and lower surfaces, and first wiring layer 157 formed on the first surface of first core base material 150. First wiring layer 157 has a group of first mounting pads 65 for mounting IC chip 180, and a group of first connection pads 164 formed on the periphery of the section where the group of first mounting pads 65 is formed (see FIGS. 1 and 8). Solder bumps 174 are formed on first connection pads 164 of first wiring substrate 110; and second substrate 10 is mounted on first substrate 110 by means of solder bumps 174. More specifically, an end of second penetrating electrode 40 protruding from the lower surface of second substrate 10 is connected first connection pad 164 of first substrate 110 by means of solder bump 174. In first wiring substrate 110, solder bumps 170 be connected an IC chip are positioned at substantially the central portion as seen in a plan view. FIG. 8 is a plan view of first wiring substrate 110. Above-described solder bumps 174 be connected second penetrating electrodes are arranged on the periphery of the section where solder bumps 170 be connected to the IC chip are formed. Solder bumps 174 for electrode connection are formed on first connection pads 164. Also, first wiring substrate 110 has first penetrating electrodes 140, which protrude from the lower surface of first core base material 150. Solder bump 176 for mounting the device on another printed wiring board or the like is formed on one end of each first penetrating electrode 140. In addition, underfill 184 is filled between the outermost surface of first wiring substrate 110 and IC chip 180.

Second wiring substrate 10 has second core base material 50, second penetrating electrodes formed inside the core base material provide electrical continuity between the upper and lower surfaces, and second wiring layer 57 formed on the first surface of second core base material 50. In the present example, the first wiring substrate and the second wiring substrate have the same structure. In the following, second wiring substrate 10 is described in detail.

Figure 2:
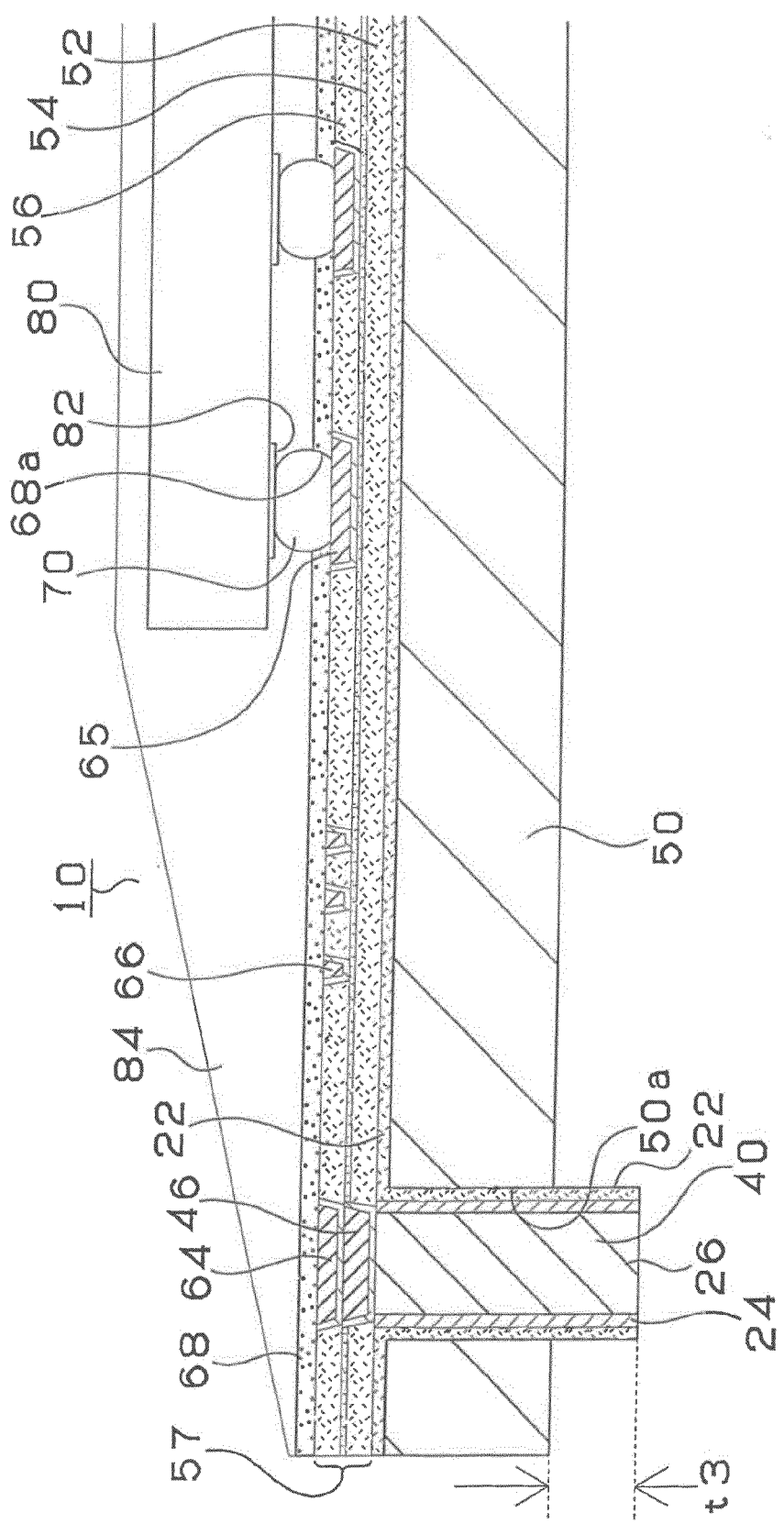
FIG. 2 is a magnified view showing inside the ellipse circled with dotted line "C" in FIG. 1.
Figure 3:
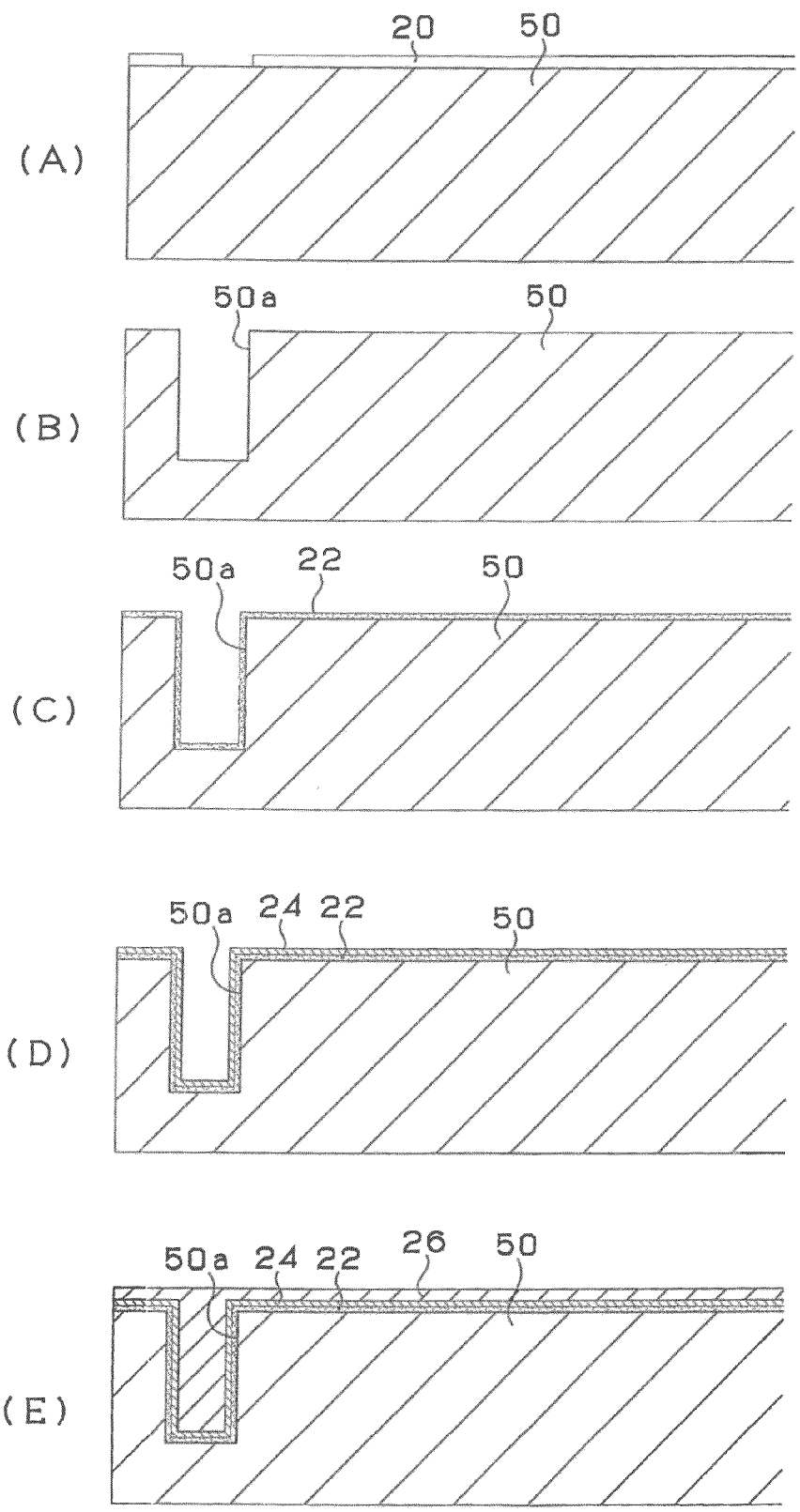
FIG. 3 are views showing the steps of manufacturing a second substrate of the example.
Figure 4:
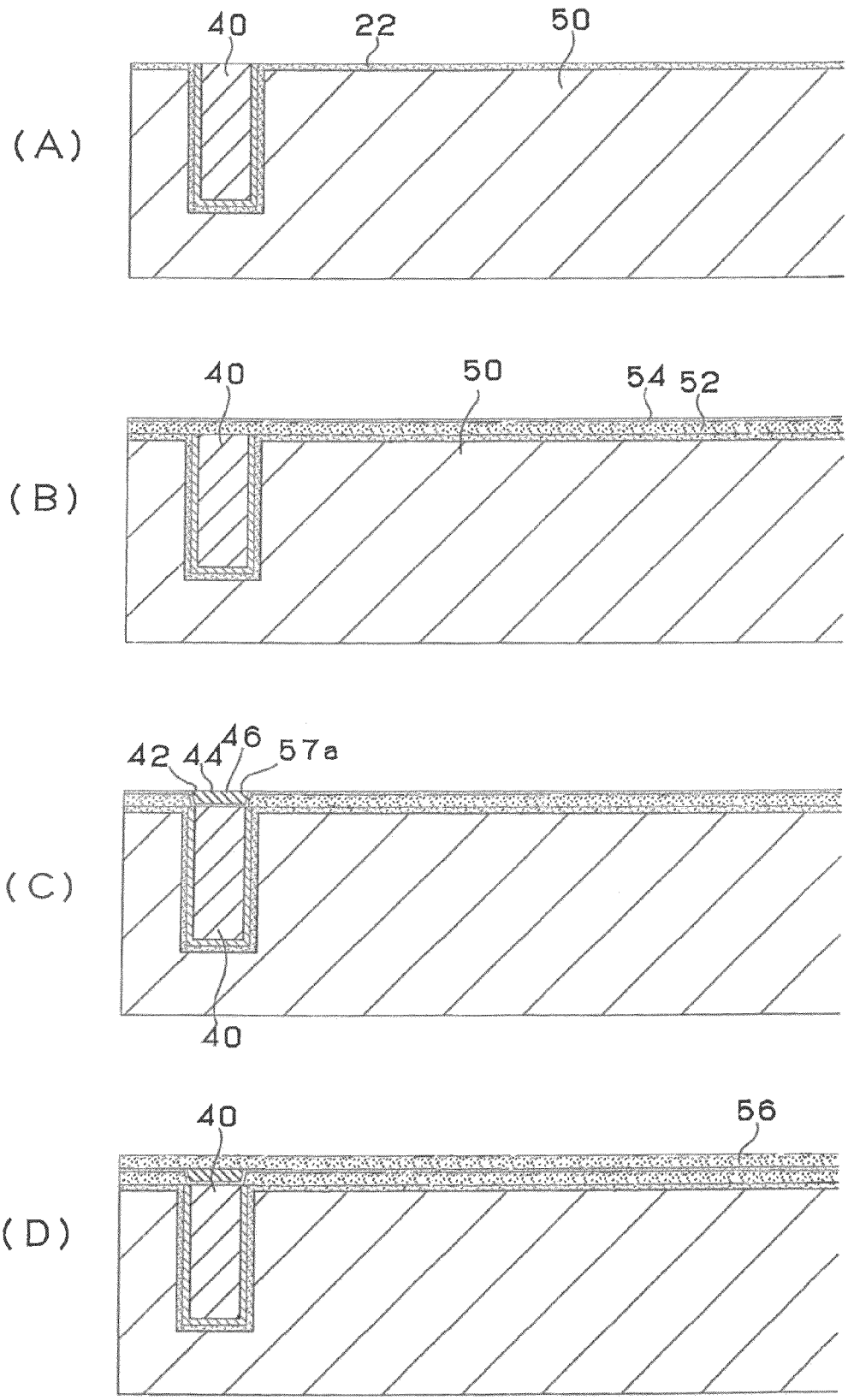
FIG. 4 are views showing the steps of manufacturing a second substrate of the example.
Figure 5:
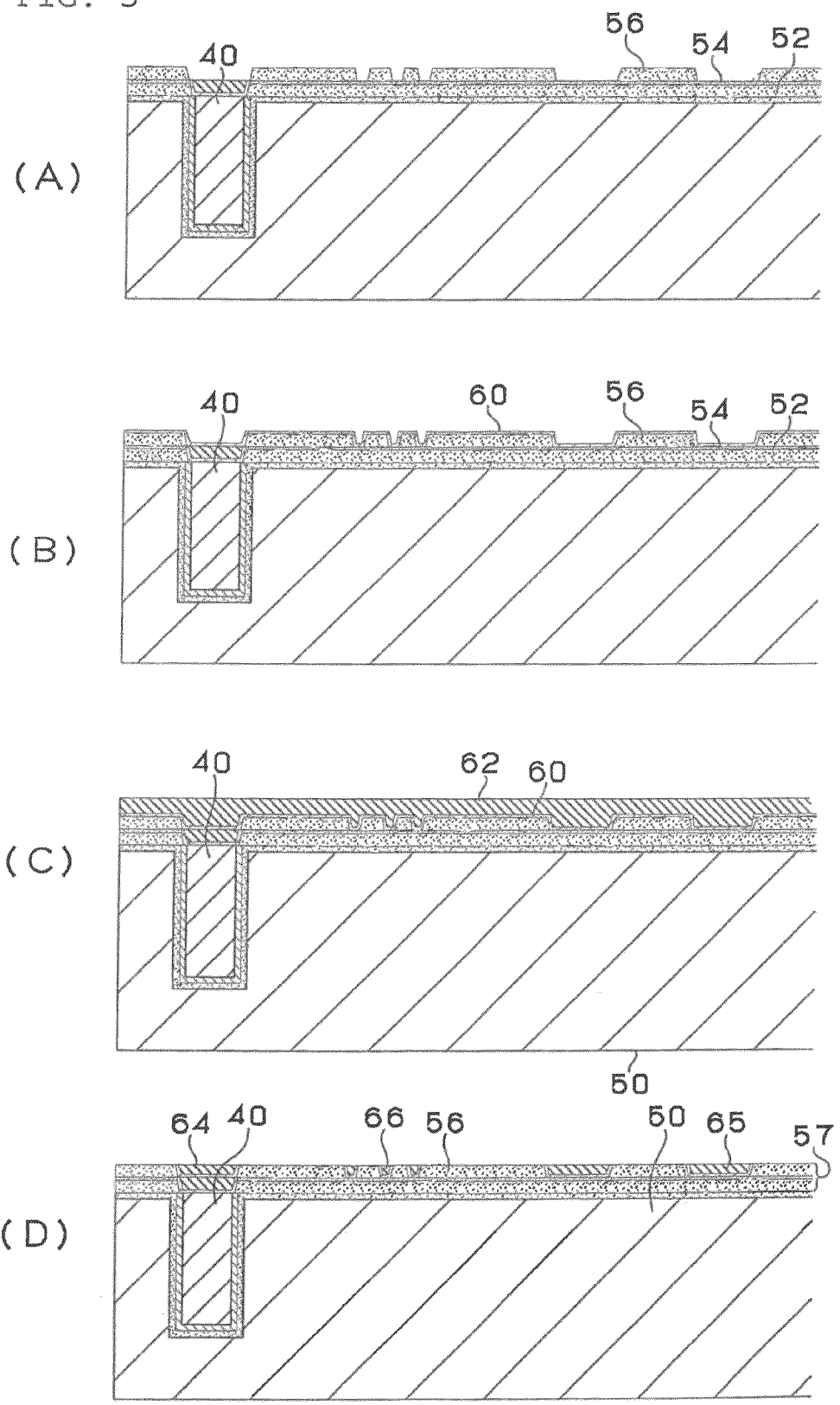
FIG. 5 are views showing the steps of manufacturing a second substrate of the example.
Figure 6:
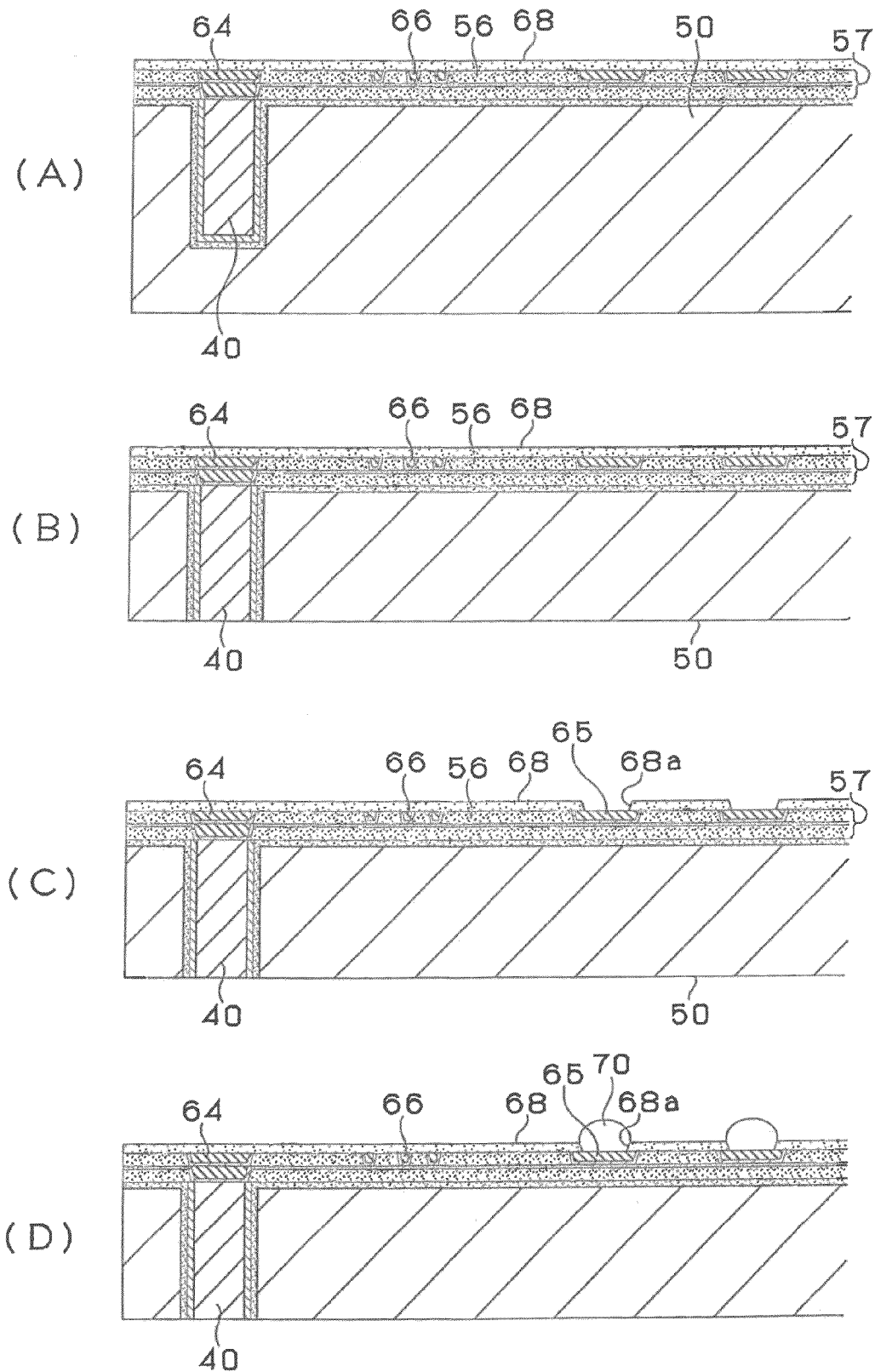
FIG. 6 are views showing the steps of manufacturing a second substrate of the example.

FIG. 2 is a magnified view of the ellipse circled with dotted line "C" in FIG. 1. Second wiring substrate 10 has silicon substrate (silicon wafer) 50 as second core base material. Surface insulation layer 22 is formed on the upper surface of silicon substrate 50. Second penetrating electrode 40 is arranged in hole portion (50a) formed in silicon substrate 50. Surface insulation layer 22 and seed layer 24 are formed in that order on the wall surface of hole portion (50a) in silicon substrate 50. Electrolytic plated layer 26 is formed in the interior surrounded by seed layer 24. Second penetrating electrode 40 is made of electrolytic plated layer 26. An end of second penetrating electrode 40 protrudes from the lower surface (second surface) of the second core base material toward the first wiring substrate.

Second wiring layer 57 of second wiring substrate 10 has multiple inorganic insulation layers 56, 54, 52. Moreover, second wiring layer 57 has land portion 64 which penetrates outermost inorganic insulation layer 56, wiring 66 formed inside outermost inorganic insulation layer 56, second mounting pad 65 formed inside the outermost inorganic insulation layer and be used for mounting IC chip 80, and via conductor 46 formed in inorganic insulation layers 54, 52. In the first wiring substrate, a group of first connection pads formed inside the outermost inorganic insulation layer is formed on the periphery of the section where a group of first mounting pads is formed. In addition, solder-resist layer 68 is formed on insulation layer 57. Opening (68a) is formed in solder-resist layer 68 expose part of second mounting pad 65. Solder bump 70 is formed inside opening (68a), and the second mounting pad is connected pad 82 of IC chip 80 by means of solder bump 70. Underfill 84 is filled between the outermost surface of second wiring substrate 10 and IC chip 80.

In the semiconductor device of the present example, since second penetrating electrode 40 of second wiring substrate 10 protrudes from the lower surface of the second core base material toward the first wiring substrate, distance (t1) from a connection pad of the first wiring substrate is reduced. Therefore, even if the height of solder bump 174 formed on first connection pad 164 of first wiring substrate 110 is set lower (setting the diameter of solder bumps smaller), second wiring substrate 10 and first wiring substrate 110 may be connected. In addition, by making the diameter of solder bump 174 smaller, the pitch of solder bumps may be set narrower, leading to a fine pitch. Also, by reducing the solder amount, connection resistance between the first wiring substrate and the second wiring substrate may decrease. Furthermore, by reducing the solder amount, the amount of heat the substrate receives from the reflow process decreases when mounting the second wiring substrate on the first wiring substrate. In addition, when connecting second penetrating electrode 40 solder bump 174, the bonding area may be enlarged by bonding the solder bump the side surface as well as the bottom surface of second penetrating electrode 40. Thus, adhesiveness may be enhanced between second penetrating electrode 40 and solder bump 174. Moreover, by adjusting protruding amount (t3) of second penetrating electrode 40 from silicon wafer 50 as shown in FIG. 2, second penetrating electrode 40 is disposed in a post configuration between second substrate 10 and first substrate 110. Accordingly, the difference between the forces in both substrates may be mitigated.

In a semiconductor device of the present example, since second penetrating electrodes 40 are made of copper plating 26, the plasticity of second penetrating electrodes 40 is high and reliability seldom diminishes during a heat cycle. Since thermal conductivity of second penetrating electrodes 40 made of copper is higher than solder bumps 174 made of solder, warping caused by the heat generated locally from the current flows in solder bumps may be prevented in second substrate 10 and first substrate 110.

In the following, the steps for manufacturing the second substrate described above with reference FIG. 2 are described by referring FIGS. 3-7.

(1) As shown in FIG. 3(A), after forming resist mask 20 with a predetermined pattern on silicon wafer 50, opening portion (50a) is formed as shown in FIG. 3(B) by dry etching (reactive ion etching) or wet etching using an alkaline solution. Here, dry etching is used; however, an opening portion may also be formed by a UV laser, for example.

(2) As shown in FIG. 3(C), insulative film 22 made of $SiO_2$ is formed on the surface of silicon wafer 50 and in opening portion (50a) by chemical vapor deposition (CVD).

(3) As shown in FIG. 3(D), seed layer 24 is formed by sputtering Ti/Cu. Here, the seed layer was formed by sputtering, but a seed layer may also be formed by electroless plating.

(4) As shown in FIG. 3(E), electricity is passed through seed layer 24, and electrolytic copper-plated film 26 is formed on the seed layer, filling opening portion (50a).

(5) As shown in FIG. 4(A), the copper-plated film is polished until insulative film 22 on silicon wafer 50 is exposed. As for such polishing, chemical mechanical polishing (CMP), buff polishing or the like may be used.

(6) As shown in FIG. 4(B), first $SiO_2$ layer 52 and $Si_3N_4$ layer 54 are formed on silicon wafer 50. Then, as shown in FIG. 4(C), via conductor 46 is formed directly on penetrating electrode 40 as a land portion. Regarding the process form via conductor 46, omitted from the drawing are the steps form opening (57a) in first $SiO_2$ layer 52 and $Si_3N_4$ layer 54, form seed layer 42, form electrolytic plated layer 44 and polish the layers. As shown in FIG. 4D, second $SiO_2$ layer 56 is formed on $Si_3N_4$ layer 54 using a chemical vapor deposition (CVD) method. As shown in FIG. 5A, a resist mask (not shown in the drawing) is formed on second $SiO_2$ layer 56, and openings that penetrate second $SiO_2$ layer 56 are formed by reactive ion etching (RIE) at predetermined spots where land portions, wiring and mounting pads will be formed. During such RIE, $Si_3N_4$ layer 54 works as an etching stopper. As shown in FIG. 5B, seed layer 60 is formed by sputtering, for example, on the surface of second $SiO_2$ layer 56 including openings. In the present example, seed layer 60 is formed with sputtered films of TaN, Ta and Cu from the bottom in that order. However, the present example is not limited such. As shown in FIG. 5C, electrolytic copper plating is performed using seed layer 60 as a power-supply layer to form electrolytic copper-plated layer 62 (FIG. 5C). Electrolytic copper plating may be formed by a conventionally known method.

(11) Chemical mechanical polishing (CMP) is performed remove electrolytic copper-plated layer 62 along with seed layer 60 on second $SiO_2$ layer 56 (FIG. 5D). Such CMP may be conducted using a method and equipment known in a conventional damascene method. The portions of electrolytic copper-plated layer remaining after the CMP become land 64, wiring 66 and pad 65. Through the process described so far, second wiring layer 57 may be formed.

(12) Insulative film 68 is formed on second wiring layer 57 (FIG. 6A). As shown in FIG. 6B, second penetrating electrode 40 is exposed by polishing silicon wafer 50. Then, as shown in FIG. 6C, opening (68a) expose pad 65 is formed in insulative film 68. form insulative film 68, a method such as applying uncured photosensitive polyimide resin with a roll coater or the like may be used. form openings, for example, an exposure and development treatment may be used. As the material for insulative film 68, inorganic material such as SiO2 or the like may also be used.

(13) Solder bump 70 is formed by printing solder paste in opening (68a) of insulative film 68, and by reflowing the solder (FIG. 6D).

(14) As shown in FIG. 7A, the lower side of silicon wafer 50 is dissolved by wet etching using a KOH solution so that second penetrating electrode 40 protrudes from silicon wafer 50. As shown in FIG. 7B, an IC chip is mounted by connecting electrode 82 of IC chip 80 pad 65 by means of solder bump 70.

Next, as shown in FIG. 7C, underfill 84 is filled between second wiring substrate 10 and IC chip 80. After that, second wiring substrate 10 is mounted on first wiring substrate 110 by means of solder bump 174 formed on a connection pad of first wiring substrate 110 (see FIG. 1).

First Modified Example

In the example, wiring layers are formed using a damascene method; however, they may be formed using a semi-additive method. In such a case, insulation layers are formed with resin.

Second Modified Example

In the example, core base materials are made of silicon. However, they may be formed by ceramics such as AlN or SiC, glass or resin. In such a case, it is preferred use resin with a thermal expansion coefficient of 2.5-10 ppm.

Third Modified Example

In the example, penetrating electrodes are formed with electrolytic copper plating. However, they may be formed by solder plating as shown in FIG. 9. In such a case, stress between the first wiring substrate and the second wiring substrate may be mitigated effectively.

A semiconductor device according one embodiment of the present invention includes: a first substrate having a first surface on which a semiconductor element is mounted and a second surface opposite the first surface; a first mounting pad formed on the first-surface side of the first substrate and for mounting a semiconductor element; a first connection pad formed on the first-surface side of the first substrate and arranged on the periphery of the section where the first mounting pad is formed; a first penetrating electrode formed inside the first substrate and connecting the first-surface side and the second-surface side; a second substrate formed on the first substrate and having a first surface on which a semiconductor element is mounted and a second surface opposite the first surface; a second mounting pad formed on the first-surface side of the second substrate and for mounting a semiconductor element; a second penetrating electrode formed inside the second substrate and connecting the first-surface side and the second-surface side, one end protruding from the second surface; and a conductive member formed on the first connection pad and electrically connecting the end of the second penetrating electrode and the first connection pad.

In the semiconductor device above, a penetrating electrode that penetrates the second substrate positioned on the upper side protrudes from the surface (second surface). An end of the penetrating electrode contributes a connection with the first substrate. More specifically, a connection pad of the first substrate is connected to an end of the penetrating electrode of the second substrate by means of a conductive member. Thus, by setting a penetrating electrode formed inside the second substrate to protrude from the surface, the distance from the connection pad of the first substrate may be reduced and the volume of the conductive member between them may also be reduced. As a result, the size of the conductive member may be minimized while the space for the semiconductor element mounted on the first substrate is ensured. By minimizing the size of the conductive member, the pitch may be set narrower. Moreover, when solder material is used for the conductive member, by decreasing the solder amount, the connection resistance between the first substrate and the second substrate may be reduced. In addition, by decreasing the solder amount, the heat the substrate receives from the reflow process decreases when mounting the second substrate on the first substrate.

Obviously, numerous modifications and variations of the present invention are possible in light of the above teachings. It is therefore be understood that within the scope of the appended claims, the invention may be practiced otherwise than as specifically described herein.

What is claimed is:

1. A semiconductor device comprising:
   a first wiring substrate having a first surface and a second surface on an opposite side of the first surface;
   a plurality of first mounting pads formed on the first surface of the first wiring substrate and configured to mount a first semiconductor element on the first surface of the first wiring substrate;
   a plurality of first connection pads formed on the first surface of the first wiring substrate and positioned on a periphery of the plurality of first mounting pads;
   a second wiring substrate formed on the first wiring substrate and having a first surface and a second surface on an opposite side of the first surface of the second wiring substrate, the second wiring substrate having a second penetrating electrode which has a protruding portion protruding from the second surface of the second wiring substrate such that the protruding portion of the second penetrating electrode has a post configuration extending into a space between the second wiring substrate and the first wiring substrate;
   a plurality of second mounting pads formed on the first surface of the second substrate and configured to mount a second semiconductor element; and
   a conductive member formed on one of the first connection pads and electrically connecting an end portion of the second penetrating electrode and the one of the first connection pads,
   wherein the second wiring substrate includes a surface insulation layer formed on the second penetrating electrode such that the surface insulation layer extends along the post configuration of the second penetrating electrode.

2. The semiconductor device according to claim 1, wherein the first wiring substrate and the second wiring substrate comprise a material with a thermal expansion coefficient of 2.5-10 ppm.

3. The semiconductor device according to claim 1, wherein the first substrate includes a silicon substrate, and the second substrate includes a silicon substrate.

4. The semiconductor device according to claim 1, wherein the conductive member comprises a solder bump.

5. The semiconductor device according to claim 1, wherein the first wiring substrate has a first penetrating electrode which has an end portion protruding from the second surface of the first wiring substrate.

6. The semiconductor device according to claim 1, wherein the first wiring substrate has a first penetrating electrode, and the first penetrating electrode and the second penetrating electrode are formed by plating.

7. The semiconductor device according to claim 1, wherein the second penetrating electrode is formed in a plurality, and the plurality of second penetrating electrodes have end surfaces positioned on substantially a same plane.

8. The semiconductor device according to claim 1, further comprising an encapsulating resin encapsulating the semiconductor element.

9. The semiconductor device according to claim 1, wherein the first wiring substrate includes a substrate comprising a core base material and a first insulating layer formed on the substrate, and the second wiring substrate includes a substrate comprising a core base material and a second insulating layer formed on the substrate of the second wiring substrate, and the plurality of first mounting pads and the plurality of second mounting pads are formed in the first insulating layer and the second insulating layer, respectively.

10. The semiconductor device according to claim 1, wherein the second penetrating electrode is formed by plating.

11. The semiconductor device according to claim 1, further comprising a plurality of second land portions formed on the first surface of the second wiring substrate and positioned on a periphery of the plurality of second mounting pads.

12. The semiconductor device according to claim 1, wherein the second penetrating electrode comprises a plating material.

13. The semiconductor device according to claim 1, wherein the first wiring substrate has a first penetrating electrode comprising a plating material.

14. The semiconductor device according to claim 1, wherein the second penetrating electrode comprises a plating material, the first wiring substrate has a first penetrating electrode comprising a plating material.

15. The semiconductor device according to claim 1, wherein the first wiring substrate and the second wiring substrate are stacked through the second penetrating electrode such that the first semiconductor element is positioned between the first wiring substrate and the second wiring substrate.

16. The semiconductor device according to claim 1, wherein the surface insulation layer comprises an insulative film made of $SiO_2$.

17. The semiconductor device according to claim 1, wherein the second wiring substrate includes a silicon substrate, the second penetrating electrode is penetrating through the silicon substrate, and the surface insulation layer comprises an insulative film made of $SiO_2$.

18. The semiconductor device according to claim 1, wherein the first wiring substrate includes a silicon substrate, the second wiring substrate includes a silicon substrate, the second penetrating electrode is penetrating through the silicon substrate, and the surface insulation layer comprises an insulative film made of $SiO_2$.

19. The semiconductor device according to claim 1, wherein the second wiring substrate includes a silicon substrate, and the surface insulation layer extends over a surface of the silicon substrate.

20. The semiconductor device according to claim 1, wherein the protruding portion of the second penetrating electrode is projecting from the second surface of the second wiring substrate such that the post configuration is extending substantially between the second wiring substrate and the first wiring substrate.

* * * * *